(12) United States Patent
Kovalchuk et al.

(10) Patent No.: US 12,145,201 B2
(45) Date of Patent: Nov. 19, 2024

(54) SYSTEM FOR MANUFACTURING OF THREE DIMENSIONAL OBJECTS

(71) Applicant: JOINT STOCK COMPANY "NVO "CHERVONA HVILYA", Kiev (UA)

(72) Inventors: Dmytro Kovalchuk, Kiev (UA); Ihor Melnyk, Kiev (UA); Vitalii Melnyk, Kiev (UA); Borys Tugai, Kiev (UA)

(73) Assignee: JOINT STOCK COMPANY "NVO "CHERVONA HVILYA", Kiev (UA)

( * ) Notice: Subject to any disclaimer, the term of this patent is extended or adjusted under 35 U.S.C. 154(b) by 665 days.

(21) Appl. No.: 17/291,450

(22) PCT Filed: Oct. 28, 2019

(86) PCT No.: PCT/UA2019/000130
§ 371 (c)(1),
(2) Date: May 5, 2021

(87) PCT Pub. No.: WO2020/096558
PCT Pub. Date: May 14, 2020

(65) Prior Publication Data
US 2022/0001451 A1    Jan. 6, 2022

(30) Foreign Application Priority Data

Nov. 6, 2018  (UA) .............................. a 2018 10970

(51) Int. Cl.
*B22F 12/41* (2021.01)
*B22F 10/25* (2021.01)
(Continued)

(52) U.S. Cl.
CPC .............. *B22F 10/85* (2021.01); *B22F 10/25* (2021.01); *B22F 10/28* (2021.01); *B22F 10/36* (2021.01);
(Continued)

(58) Field of Classification Search
None
See application file for complete search history.

(56) References Cited

U.S. PATENT DOCUMENTS 5,272,347 A * 12/1993 Oae ........................ B82Y 40/00
                                                        250/396 ML
2005/0211925 A1   9/2005 Nakasuji et al.
(Continued)

FOREIGN PATENT DOCUMENTS

DE         4104845 A1    8/1992
EP         2918396 A1    9/2015
(Continued)

OTHER PUBLICATIONS

International Search Report with Written Opinion corresponding to PCT/UA2019/000130 dated Feb. 7, 2020.
(Continued)

*Primary Examiner* — George Wyszomierski
(74) *Attorney, Agent, or Firm* — Dickinson Wright PLLC (57) ABSTRACT

A system for manufacturing of three dimensional objects by layered deposition is provided. The system includes a base substrate for formation of three dimensional objects placed on a supporting plate; a functional assembly comprising a gas-discharge electron beam gun, a feedstock guide, a cold annular cathode and two annular anode electrodes, a high voltage power supply of the gas-discharge electron beam gun, a system of precise positioning of the supporting plate with the base substrate), a vacuum tight operation chamber, a vacuum subsystem for creating of necessary vacuum inside said operating chamber, a control system and a magnetic lens. The lens is placed on the underside of the gas-discharge electron beam gun coaxially with it and with the feedstock guide, providing the possibility of transformation of a primary hollow electron beam to the shape of a (Continued)

hollow inverted cone after leaving the discharge chamber of the gas-discharge electron beam gun.

4 Claims, 3 Drawing Sheets

(51) Int. Cl.
  *B22F 10/28* (2021.01)
  *B22F 10/36* (2021.01)
  *B22F 10/85* (2021.01)
  *B22F 12/00* (2021.01)
  *B33Y 30/00* (2015.01)
  *B33Y 10/00* (2015.01)
  *B33Y 50/02* (2015.01)
(52) U.S. Cl.
  CPC .............. *B22F 12/38* (2021.01); *B22F 12/41* (2021.01); *B33Y 30/00* (2014.12); *B33Y 10/00* (2014.12); *B33Y 50/02* (2014.12)

(56) References Cited

U.S. PATENT DOCUMENTS

| | | |
|---|---|---|
| 2015/0306699 A1 | 10/2015 | Honda |
| 2017/0304896 A1 | 10/2017 | Kovalchuk |
| 2021/0197278 A1* | 7/2021 | Sano .................. B22F 12/50 |

FOREIGN PATENT DOCUMENTS

| | | |
|---|---|---|
| JP | S56136285 A | 10/1981 |
| JP | S56165571 A | 12/1981 |
| SU | 294697 A1 | 12/1971 |
| SU | 1562088 A1 | 5/1990 |
| UA | 112682 C2 | 10/2016 |
| UA | 116822 C2 | 5/2018 |

OTHER PUBLICATIONS

Joe Hiemenz, Electric Beam Melting, Advanced Materials & Processes, Mar. 2007.

* cited by examiner

Fig. 3 though it is claimed that the device can be used in the production and processing of relatively large parts, in reality it is only a theoretical conclusion.

SYSTEM FOR MANUFACTURING OF THREE DIMENSIONAL OBJECTS

This application is a 371 national phase entry of PCT/UA2019/000130, filed on 28 Oct. 2019, which claims benefit of UA patent application no. a 201810970, filed 6 Nov. 2018, the entire contents of which are incorporated herein by reference for all purposes.

TECHNICAL FIELD

The invention relates to the field of metallurgy, in particular to additive manufacturing, namely to system for the manufacturing of three-dimensional objects by means of layered deposition of feedstock material on substrate.

BACKGROUND ART

There are methods and apparatus for manufacturing of three dimensional objects (for example U.S. Pat. Nos. 7,168,935 and 7,073,561) according to which three dimensional objects are formed by means of layered deposition of feedstock material on substrate when feedstock material is fed to melting zone moving relative to the substrate. Said feedstock material is then melt there by energy beam, for example by electron beam, and then solidifies when it is leaving heating zone resulting in formation of solid deposited layer of material. These methods and apparatus have such common feature as application of thermionic axial electron beam gun of welding type as energy source for forming of molten pool on the substrate and melting of feedstock material. Such type of guns has appropriate current-voltage characteristics, such as rather high accelerating voltage (60 kV and more), and they require the creation of suitable operating conditions in operating chamber, mainly high vacuum (usually $10^2$ Pa and higher). Moreover, electron beam in such methods and apparatus fall on the substrate perpendicular to its surface, and feedstock material, usually wire, is fed to the melting zone from one side under some acute angle.

These features cause some technological and financial problems among which the following problems must be underlined:

the requirement to create the specified earlier high vacuum in operating chamber as well as the need to use individual high-vacuum pumps to protect hot cathodes of electron beam gun of welding type during the process. This causes a significant increase in the cost of equipment because of the necessity to use a multi-stage vacuum system. Furthermore, a reduction of equipment efficiency can occur because of the increase in time necessary to evacuate the air from the operating chamber before the beginning each production cycle;

relatively high accelerating voltage which is necessary for operation of electron beam gun of welding type causes X-ray emission inside the operating chamber, so the protection of the people from dangers of such radiation requires the usage of much thicker operating chamber walls;

difficulties in control of feeding the feedstock material in accurate coordination with supply of electron beam to the same point on the substrate where the melting zone is formed, taking into account the movement of this zone, as well as the change in position of the electron beam gun itself and the feeding mechanism. These difficulties in coordination are compensated by the increase in the area of the melting zone which is provided by increased input of more thermal energy in this zone. This results in significant increase of size and depth of the melting bath on the substrate, and causes the formation of excessively thick and rough walls of three-dimensional objects (thickness not less than 10 mm) that are being manufactured. This drawback, consequently, requires significantly more machining to obtain the final product (from 3 to 5 mm from each surface);

forced creation of an excessively wide and deep melting bath on the substrate leads to relatively low cooling rates and solidification of the melt, resulting in a rather rough columnar metal structure, which leads to uneven mechanical properties of the obtained material in different directions;

technologically complicated use of powder as a feedstock material for surfacing.

Another known technology is a laser consolidation system for manufacturing precise structures (see US Patent US 2003/01 16542A), in which the feedstock is fed coaxially along the axis of the laser beam in the form of a hollow inverted cone. At first, this laser beam has the traditional shape of a solid cylinder and only then, due to reflection from the system of mirrors takes the form of a hollow inverted cone, with the tube for supply of feedstock which is placed directly along the axis of the continuous cylindrical beam up to the first conical mirror. In addition, according to this patent, the angle of inclination of the hollow inverted cone from the vertical line is limited by values of 25-30 degrees.

The main disadvantages of above said system are the following:

the proposed technical solution assumes melting of the fed material (powder or wire) inside the melt pool by energy accumulated in this melt pool, i.e. using indirect heating of added material. In such solution, the significantly excessive power input to the substrate is required to provide melting of added material by heat accumulated and maintained in the melt pool. In addition, any change of deposition rate must be provided by change of melt pool parameters making a pool wider and deeper due to heat conductivity, which is critical for forming of the deposited material—both for shape/size (even the destruction of previously built layers may occur) and for metal structure;

power of a laser is limited by the modem means of its generation, and the modem laser efficiency is quite low, especially during the process of machining of dense objects with high reflectivity such as metals and alloys in the form of wire. Therefore, the laser can be an effective means of heating only using the high concentration of energy, which can be achieved by fine focusing of the beam. In mentioned above technical solution, the scheme on the contrary provides the distribution of power over a sufficiently large area, thereby dramatically reducing the possible concentration of energy on the target. The use of a defocused laser cannot guarantee acceptable efficiency during this additive manufacturing process;

the proposed technical solution cannot be used to maintain the melting process for sufficiently long periods of time because the hollow conical laser is formed by reflection of a narrow beam by the system of profile mirrors This implies that the source of the hollow conical beam is passive and the parameters of the beam depend on various complex physical phenomena, processes, and factors that affect optical system such as vibration, dust, heat, etc. which result in obvious consequences for specialists. It is impossible to completely prevent the dusting of optical elements (mirrors) by vapors of metals during the process, which will very quickly reduce the already low effective power of the laser; it is impossible to cool the optical elements (mirrors) during the surfacing process when the melt bath generates constant intense thermal radiation; it is not possible to provide a cooling device for feedstock from the same thermal radiation, minute vibrations of the optical system results in deflections of the beam from a predetermined focus and further decrease the energy concentration at the target.

The closest in technical essence to the present invention is a system for the manufacture of three-dimensional objects (see patent of Ukraine No. 112682).

The known system for the manufacture of three-dimensional objects includes a base substrate for the formation of three-dimensional objects placed on a support plate, a construction module in the composition of the discharge electronic gun and a guide device for supplying of feedstock to the area of formation of the bath melt, the power source of the discharge of electron-beam gun, a system for accurately positioning of base plate with a base support for formation of three-dimensional objects, a sealed technological chamber which contains said base substrate on a base plate, and a system for accurately positioning the base plate with substrate, a vacuum system, a control system designed to control equipment, tools, mechanisms that are part of a specified device to collect data on the status of all systems of that device and to control the process.

Said functional assembly comprising of gas-discharge electron beam gun and feedstock guide is fixed rigidly inside operating chamber, and moving of said melting zone relative to the said base substrate along the trajectory specified by operator or program is provided by means of moving of said supporting plate with attached base substrate for forming of specified three dimensional objects under control of said positioning subsystem.

The other configuration of functional assembly comprising of gas-discharge electron beam gun and feedstock guide is fixed rigidly on the top plate of said operating chamber in such a way that only those parts of said gas-discharge electron beam gun which are attached to the said base flange of said functional assembly from below are placed inside vacuum space of operating chamber, and feedstock material in this case is fed to operating chamber from outside through vacuum tight wire feedthrough equipped by set of sealing inserts.

Also in this functional assembly comprising of gas-discharge electron beam gun and feedstock guide with the supply system of feedstock can be moved within the three-dimensional space of the operating chamber due to the rigid fixation of the coordinate system of movement on the frame, equipped with a system of precise positioning, thereby ensuring the displacement of the formation melting pool and supply of feedstock zones relative to the substrate according to the trajectory specified by an operator or a program.

In the mentioned invention, the gas-discharge electron beam gun has a base flange with a hole in its center, and the feedstock guide for feeding of feedstock material is fixed coaxially in this hole of the base flange. The gun's body and high voltage circular insulator with affixed to it the circular cathode are coaxially attached to the underside of the base flange along with the inner annular anode electrode which is coaxially fixed in the hole of the base flange along with the feedstock guide. The gun's body has also a function of external anodic electrode.

The emission surface of the cold circular cathode has the shape of a segment of the sphere, the center of which is located on the axis of the electron beam gun and determines the position of the apex of the conical electron beam created by the specified electron gun.

Cold circular cathode is made from one of the following materials: aluminum, aluminum alloys, stainless steels.

Circular insert with the shape of segment of a sphere can be inserted into the emission surface of the circular cathode, and said insert can be made of one of the following materials with high emission ability: aluminum, aluminum alloys, and hexaboride of lanthanum.

Circular cathode can be designed with possibility of water cooling, in this case circular cathode is made with circular cavity for cooling water.

Circular cathode can be attached to high voltage insulator through a circular cathode holder which is made from a stronger material than the circular cathode.

Circular cathode holder can be designed with possibility of water cooling, in this case circular cathode holder is made with circular cavity for cooling water.

Cylindrical surface of circular cathode can be surrounded by cylindrical by-cathode electrode.

Circular high voltage insulator can have a shape of a ring with extended free surfaces.

Gun's body can be designed with top cylindrical part which is attached to base flange of electron beam gun and bottom conical part which has a shape of inverted conoid.

The structure of a feedstock guide can be designed in a way that water cooling would be completely or partially situated in its conical part.

Accelerating voltage of gas-discharge electron beam gun can be regulated within the limits of 5-45 kV.

Power of the electron beam is provided by gas-discharge electron beam gun with its power supply up to 45 kW and it can be regulated within the limits of 0-45 kW.

Vacuum system provides operating vacuum within the range of $10\text{-}10^{-2}$ Pa in said operating chamber during the process of manufacturing of three dimensional objects within range of $10\text{-}10^{-2}$ Pa.

Operating gas for gas-discharge electron beam gun is selected from one of the following gases: hydrogen, oxygen, a mixture of hydrogen and oxygen, nitrogen, helium, argon, air, methane.

Control of electron beam power is accomplished by means of controlling the electron beam current, which is regulated by means of changing the operating gas pressure inside the gas-discharge electron beam gun.

Feedstock materials in the form of wire, wire bundle, cored wire, rods, powder, mixture of powders can be selected from the following materials: titanium, titanium alloys, intermetallic compounds of titanium, niobium, niobium alloys, intermetallic compounds of niobium, tantalum, tantalum alloys, aluminum, aluminum alloys, intermetallic compounds of aluminum, nickel based alloys, cobalt based alloys, tool steels, and composite matrix.

Feedstock guides for feeding of different kinds of feedstock materials are changeable inside the same said functional assembly of gas-discharge electron beam gun and feedstock guide.

The above mentioned device for production of three dimensional objects has the following major disadvantages:
the angle of inclination of the conical hollow electron beam relative to the vertical axis is fixed for each configuration of the electrode system, which is determined by the shape of emission surface of the cathode and by mutual placement of the cathode and the anode system, which in turn consists of a gun's body and an internal annular anode electrode. That is, to change this angle of inclination of a conical hollow electron beam relative to the vertical, it is necessary to change almost the entire design of the gun. The fixed angle of inclination of the conical hollow electron beam relative to the vertical determines the fixed position of the focus of the electron beam and, accordingly, the position of the area of formation of the melting pool and the supply of feedstock. This is useful for maintaining the same material deposition conditions at each layer, which is important to ensure that the conditions of forming a three-dimensional object are repeated throughout the process. However, it does not provide the industrial flexibility to develop optimal technological modes for the production of three-dimensional objects made of different materials and/or wire of different diameters;

the location of the circular gap through which the conical hollow beam exits the gun is in the immediate vicinity of the area of the formation of the melting pool and feedstock supply. This creates the conditions for the ingress of metal vapors, and in the case of using the powder as a feedstock material, even particles of this powder reflected from the substrate, to enter the cavity of the gun. This can firstly affect the stability of electron beam generation, and secondly, gradually dust the cathode emission surface due to condensation of the electron beam, thereby changing the emission properties of the cathode;

placement of the gun body close enough to the area of formation of the deposited layer significantly reduces the possible viewing angles of this area, which complicates the conditions for observing the technological process of forming the next deposited layer of material.

SUMMARY

The basis of the invention is the task of developing of equipment for the manufacture of three-dimensional objects with an extended term of continuous reliable operation, an extended range of adjustment of technological parameters of the process, simplification of manufacturing and maintenance of the elements of the system, improvement of conditions for observing the technological process, as well as increased equipment work.

The positive technical result is achieved by the fact that the proposed system for the manufacture of three-dimensional objects by layered deposition, which includes:

the base substrate for the formation of three dimensional objects placed on a supporting plate, the functional assembly comprising of gas-discharge electron beam gun with a cold annular cathode located between two annular anode electrodes coaxially placed to the cathode, and feedstock supply guide to the area of formation of the melting pool, which is placed along the axis of the said electron beam gun, the high voltage power supply of the gas-discharge electron beam gun,—a system of precise positioning of the supporting plate with base substrate for the formation of three-dimensional objects, vacuum tight operating chamber for enclosing of said base substrate on supporting plate, said positioning subsystem and in some embodiments also enclosing of said electron beam gun, said feedstock and said feed means for feeding of feedstock material, the vacuum subsystem for creation of necessary vacuum inside operating chamber, control system for control of all equipment, mechanisms, subsystems and instruments included to said complete manufacturing system, for monitoring of operating conditions of all said equipment, mechanisms, subsystems and instruments and for control by technological process of manufacturing of three dimensional objects, according to the invention additionally contains a magnetic lens placed on the underside of the electron beam gun coaxially with it and with the feedstock guide, and this lens would provide the possibility of transformation of a primary hollow electron beam, directly generated by the electron beam gun, to the shape of a hollow inverted cone after its leaving the discharge chamber of the electron gun, and an angle of inclination of the generating surface of this hollow cone can be adjusted by changing the current in the magnetic lens.

In this case, the emission surface of the cold circular cathode can be flat and perpendicular to the axis of the electron gun, and thus provide direct generation of the electron beam in the form of a hollow cylinder coaxial with the electron gun. In another configuration, the emission surface of the cold circular cathode may be in the form of a part of the formation surface of the inverted cone coaxial with the electron gun. The top of this cone is on the axis of the cannon below the emission surface of the cathode. This enables the direct generation of the electron beam in the form of a hollow cone coaxial with the electron beam gun. Also, the emission surface of the cold circular cathode may be in the form of an upper lateral part of the inner surface of the toroid's annular circle, the axis of rotation of which coincides with the axis of the electron gun. The center of the annular circle is in the middle of the annular slit for exit of the electron beam outside the discharge gap of the gun. In this configuration, the beam obtains the form of a hollow cone coaxial with an electron gun.

The body of gas-discharge electron beam gun can be made in the form of a cylinder with a hole in the center of its bottom made for the purpose of placing the feedstock guide along the axis and forming of annular gap on the outlet of the gun between the bottom of the cylinder and the inner annular anode electrode attached to the feedstock guide. The inner diameter of this gap has to be larger than the inner diameter of the annular cathode.

The body of gas-discharge electron beam gun can be designed with the possibility of water cooling in whole or in part, for example at its bottom. The inner annular anode electrode can be designed with the possibility of cooling.

The position of the magnetic lens along the axis of the gun can be fixed or variable.

The feedstock guide device in the functional assembly can be movable with the possibility of adjusting the distance, which it protrudes beyond the body of the gas-discharge electron beam gun.

The proposed technical solution to apply a magnetic lens to change the shape and angle of the primary hollow electron beam by changing the electric current in the magnetic lens allows the formation of an electron beam in the form of an inverted cone with an apex on the axis of the gun and the flexible regulation of the angle of this hollow cone in wide range from 5 angular degrees to 80 angular degrees. Thus, the same device for the manufacture of three-dimensional objects enables quick and convenient changes in the position of the focus of the electron beam along the axis of functional assembly, depending on the technological tasks. For example, this may be useful in case of repairing a complex part by layer-by-layer filling of a specific recess in a repaired part.

The primary electron beam can be generated directly in the form of a hollow cylinder coaxial with the electron gun in the case of a cold annular cathode with a flat emission surface perpendicular to the axis of the electron gun. Also, the primary electron beam can be directly generated in the form of a hollow cone in the case of a cold annular cathode with an emission surface in the form of a solid surface of the inverted cone, which apex is on the axis of the gun below the emission surface of the cathode. In other variant, the primary electron beam can be directly generated in the form of a hollow cone in the case of a cold annular cathode with an emission surface in the form of an upper outer surface of the toroid which axis of rotation coincides with the axis of the electron gun, and the center of its generating circle is in the middle of the annular gap where the electron beam exits from the discharge chamber of the gun.

As soon as the initial beam has left the discharge chamber of the gun, it falls under the influence of the magnetic field of the magnetic lens, located on the underside of the gun's body coaxially with it and the whole functional assembly. This magnetic field deflects the electrons towards the axis of the magnetic lens, and accordingly towards the axis of the entire functional assembly. Thus, the beam remains hollow, but takes the form of an inverted cone, the angle of inclination of the surface of which changes depending on the current of the magnetic lens. This automatically changes the position of the deposition zone, which approximately coincides with the top of inverted cone. Because of this feature, the position of the deposition zone can be adjusted in a wide range of conditions for the formation of a melt pool on the surface of the substrate and the melting of feedstock.

Also, this solution allows to remove substantially the annular gap through which the electron beam leaves the discharge chamber of the gas-discharge electron beam gun from the area of formation of the melt pool and the melting of feedstock. This significantly prevents the ingress of metal vapors from this zone from entering the gun's internal space, and the direct visibility of the cathode from melting zone is completely excluded. Thus, much more stable conditions for the operation of the electron beam gun are provided, and thus the conditions for conducting the entire technological process are improved. Consequently, the lifetime of the circular cathode is extended, the cathode is continuously operated between the regular cleaning of the emission surface, the thermal load on the cathode is reduced and so on.

The use of a cathode with a flat surface greatly simplifies its manufacture, cleaning and alignment of its emission surface. The implementation of the gun body in the form of a cylinder also significantly simplifies its manufacture, especially in the versions with full or partial cooling.

The possibility of independent formation of a conical hollow beam outside the gun under the influence of a magnetic lens, together with the possibility of using feedstock guide of different lengths or adjustable movement of the feedstock guide along the axis of the functional assembly allows to shift the focus of the electron beam to the optimum distance from the gun. Besides protecting of gun cavity from the impact of the process and expanding technological flexibility this option also provides a much better view of the deposition zone, which is important for proper monitoring of the production process.

In general, the present invention provides significantly improved and more stable operating conditions of the device for the manufacture of three-dimensional objects, increased lifetime of continuous reliable operation of the entire device and its key components, expanded the range of adjustment of technological parameters of the process, simplified the manufacturing and maintenance of the elements of the device, and improved the conditions of observation, as well as increased the overall life of the equipment.

BRIEF DESCRIPTION OF DRAWINGS

The invention is illustrated by the following drawings, where all the similar elements of the claimed system depicted in the drawings (FIG. 1-FIG. 3) have the same numbering.

DESCRIPTION OF EXAMPLE EMBODIMENTS

Figure 1:
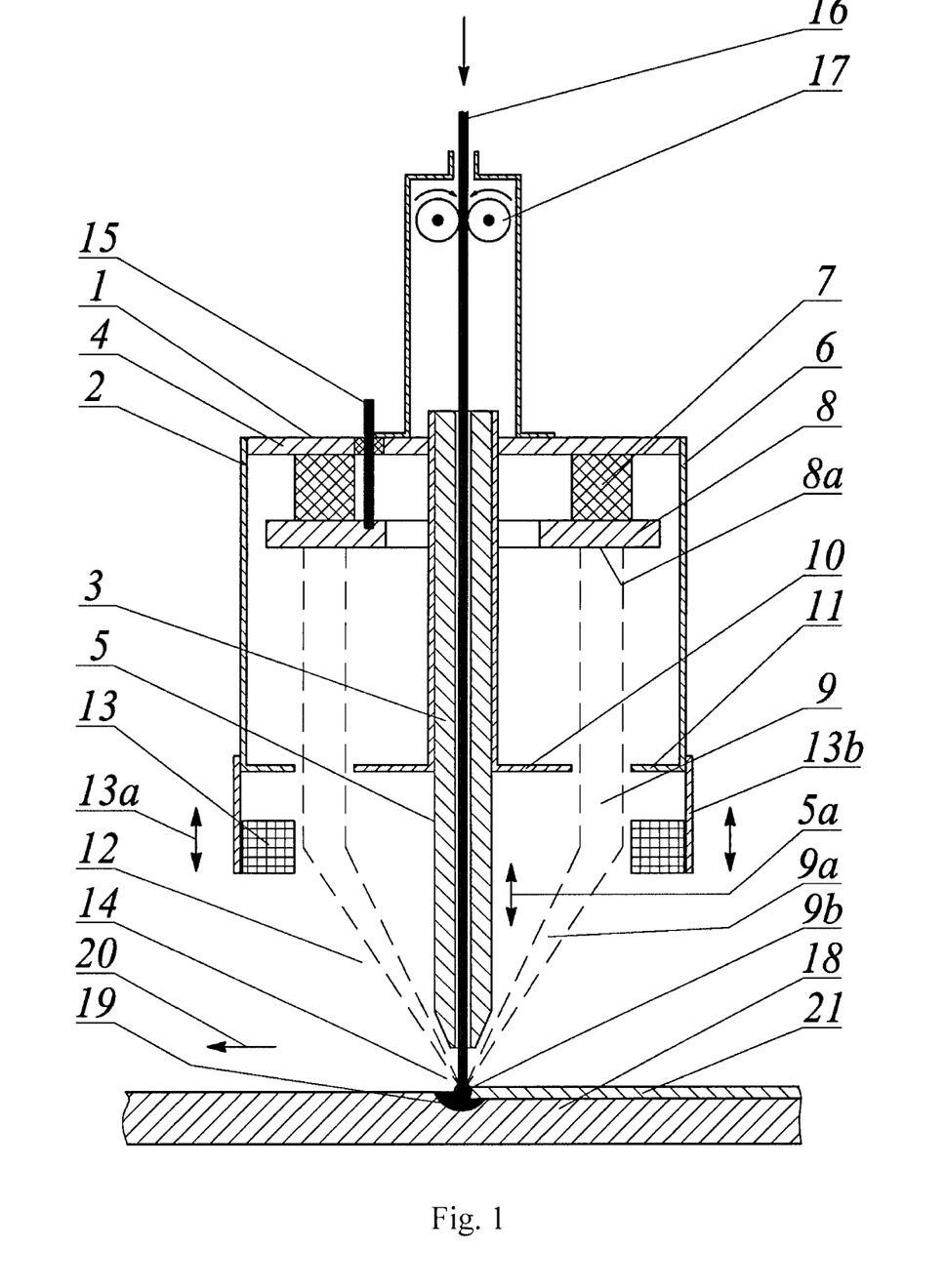
FIG. 1 is general view of a functional assembly, which is the main element of a system for the manufacture of three-dimensional objects, in the design with a circular cathode, the emission surface of which is flat and perpendicular to the axis of the electron beam gun.

A general view of a functional assembly, which is the main element of a system for the manufacture of three-dimensional objects, in the design with a circular cathode, the emission surface of which is flat and perpendicular to the axis of the electron beam gun is depicted in FIG. I.

The functional assembly 1 which is formed by a gas-discharge electron beam gun 2 and a feedstock guide 3 combined together in a single assembly unit by means of rigid fixing the body of the feedstock guide 5 in the central hole of the base flange 4 of the electron gun coaxially with said base flange. The gun's body 6 and a throughput high-voltage circular insulator 7 through which an annular cathode 8 is mounted between two annular anode electrodes arranged coaxially to the cathode are tightly attached to the base flange 4 of the electron beam gun. In FIG. I, the emission surface 8a of the annular cathode 8 is flat and perpendicular to the axis of the electron beam gun, providing direct generation of the electron beam 9 in the form of a hollow cylinder. The inner annular anode electrode 10 is secured in the central hole of the base flange along the feedstock guide 5 and coaxially therewith, and the gun's body 6 with its bottom part 11 serves as an external anode electrode. The gun's body 6 with the bottom part 11 and the body of the feedstock guide 5 forms a discharge chamber 12 of the electron gun 2.

The magnetic lens 13 is positioned on the underside of the electron beam gun coaxially with it and with the feedstock guide. The magnetic lens can be fixed in a fixed position on the gun body or on a separate bracket 13b, as shown at the picture. Arrow 13a shows the possibility of adjusting the position of the magnetic lens relative to the gun along its axis. As soon as an electric current is fed into the magnetic lens, a magnetic field is generated, that deflects the electrons of the primary electron beam from the primary trajectory in the direction of the axis of the magnetic lens, which is the axis of the entire functional assembly. Thus, the primary hollow cylindrical electron beam 9, directly generated by the electron gun, is converted to the electron beam 9a in the form of a hollow inverted cone with an apex 9b on the gun axis. The angle of the conical surface of the cone, and with it, the position of the apex of the cone, can be regulated by changing the current in the magnetic lens. Such technical solution makes it possible to choose the optimal angle of the hollow conical electron beam for each technological task.

The bottom part 1 1 of the electron gun and the inner annular anode electrode 10 are forming an annular gap 14 to exit the cylindrical hollow electron beam 9 outside the electron gun. The working gas is fed into the discharge space of the gun 12 through the nipple (not shown), cut into the body 6 of the electron gun or into the support flange 4.

High voltage is applied to the cathode through the plug-in connector 15, which is fed to the cathode through an electrically insulated hole in the base flange 4. The feedstock material 16 (in the figure shown is a wire) is fed to the guide device 3 from the upper end through the feed mechanism 17.

In this case, the functional assembly 1 is positioned relative to the substrate 18 so that the top of the hollow cone 9b formed by the electron beam 9a, which has an angle that is optimal for this technological problem, is near the surface of the substrate 18. The length to which the body of the feedstock guide 5 protrudes from the functional assembly 1 is also adjusted accordingly, to ensure the optimum supply of the feedstock material 16 in the melting zone 14 and to avoid damaging the body of the feedstock guide 5 by the beam of the electron beam 9a. Arrow 5a shows the possibility of a controlled change in the distance to which the body of the feedstock guide 5 protrudes beyond the gun's body 2. Arrow 5a shows the possibility of a controlled change in the distance to which the body of the feedstock guide 5 protrudes beyond the body of the electron beam gun 2.

The energy of the concentrated electron beam 9a forms on the surface of the substrate 18 a melt pool 19. The feedstock material 16 in the form of a wire is fed into the melting zone where the specified melt pool 19 is formed. The end of the wire in this zone is uniformly covered by the specified electron beam 9a and under the action of its energy is melted directly in the melt pool or melt above it in such a way that the molten material from the end of the wire falls directly into the melt pool 19.

Arrow 20 indicates the movement of the functional assembly 1 relative to the substrate 18, which also means the movement of the melt pool 19. The melt pool, formed from the previous position of the functional assembly 1, solidifies rapidly due to heat conductivity into the mass of the substrate and thermal radiation from the surface of the melt pool, forming a deposited layer of material 21, which increases the height of the substrate by a certain amount. It should be noted that the movement of the functional assembly 1 relative to the substrate 18 can occur both due to the movement of the substrate 18 and due to the movement of the functional assembly 1, or due to the simultaneous movement of both of these elements.

Figure 2:
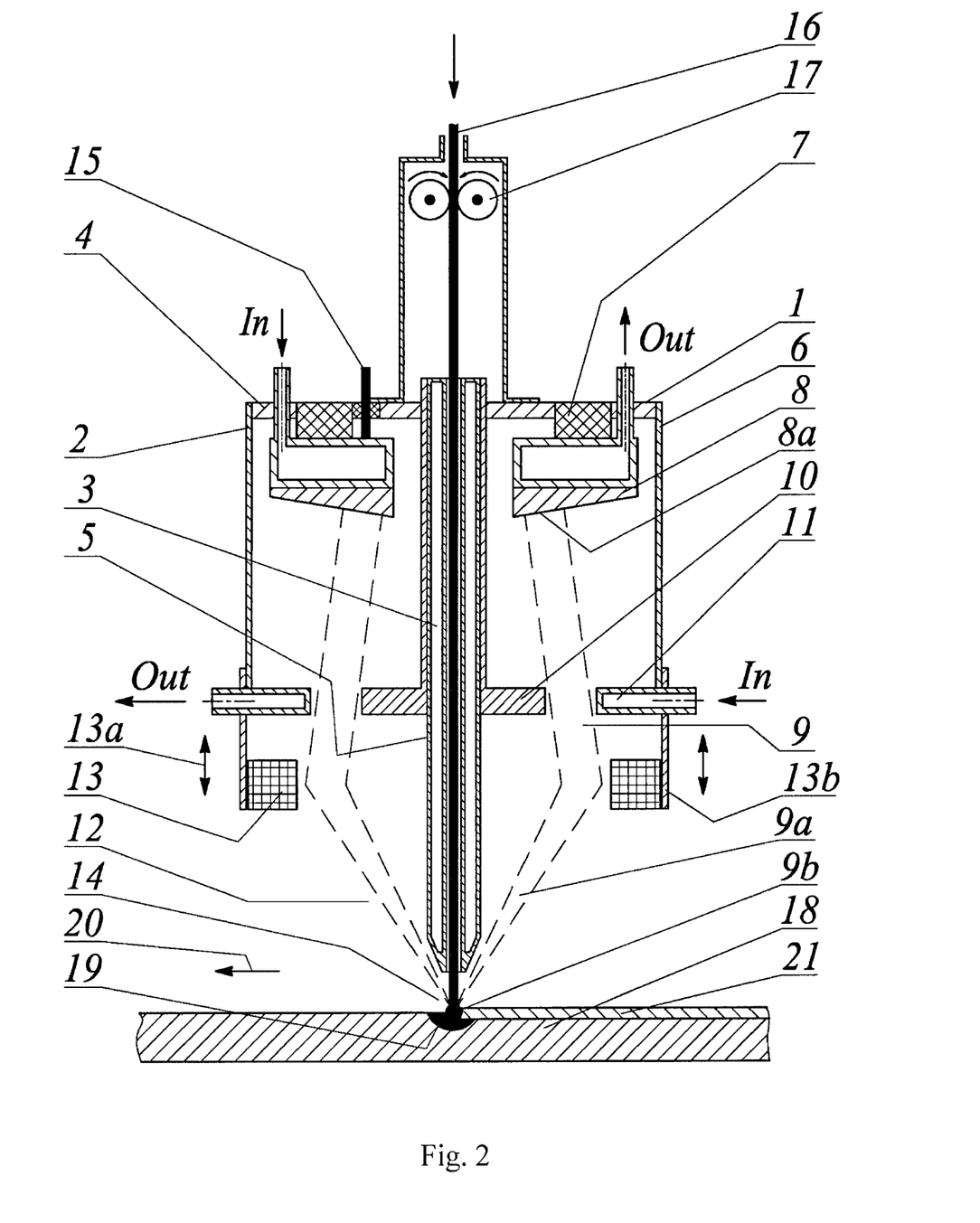
FIG. 2 illustrates a variant of functional assembly 1, in which the circular cathode of the gas-discharge electron gun has an emission surface in the form of a solid surface of the inverted cone, the top of which is on the axis of the gun below the emission surface of the cathode.

In FIG. 2 presents a variant of functional assembly 1, in which the circular cathode of the gas-discharge electron gun has an emission surface in the form of a solid surface of the inverted cone, the top of which is on the axis of the gun below the emission surface of the cathode. The circular cathode 8, the inner annular anode electrode 10 and the bottom part 11 of the body of the gas discharge electron gun in FIG. 2 are shown in the water-cooling version.

Figure 3:
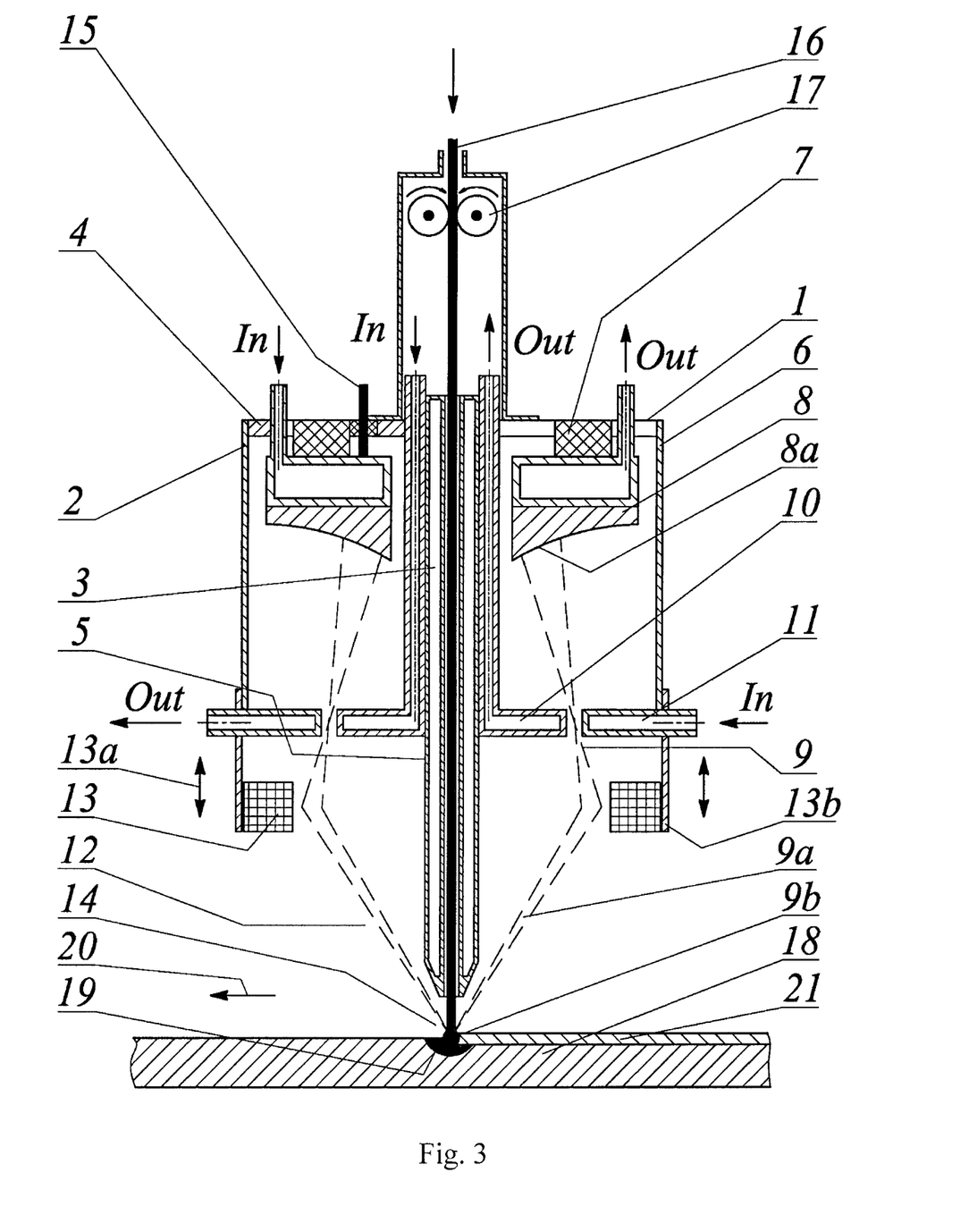
FIG. 3 is an example of functional assembly 1, in which the circular cathode of the gas discharge electrode gun has an emission surface in the form of the upper lateral part of the inner surface of the generating circle of the toroid.

In FIG. 3 presents an example of functional assembly 1, in which the circular cathode of the gas discharge electrode gun has an emission surface in the form of the upper lateral part of the inner surface of the generating circle of the toroid. Its axis of rotation coincides with the axis of the electron gun, and the center of the generating circle is in the middle of the annular gap for the exit of the electron beam outside the discharge chamber of the gun. This solution minimizes the width of the annular gap to exit the electron beam from the discharge chamber of the gun, providing the best protection of the cathode from the negative influence of technological process and significantly reducing the consumption of working gas required to maintain a specified value of the electron beam current.

INDUSTRIAL APPLICABILITY

The proposed system for the manufacture of three-dimensional objects can be used for efficient and high-quality production of parts of complex shape, especially of highly active materials that require the processes associated with their melt in a protective atmosphere, and/or the melting of which requires the use of heat sources with high energy concentration, such as titanium, titanium alloys, intermetallic compounds of titanium, niobium, niobium alloys, intermetallic compounds of niobium, tantalum, tantalum alloys, aluminum, aluminum alloys, intermetallic compounds of aluminum, nickel alloys, cobalt alloys, tool steels, and more.

What is claimed is:
1. A system for the manufacture of three-dimensional objects by layered deposition comprising of:
   a base substrate for the formation of three-dimensional objects placed on a supporting plate,
   a functional assembly comprising a gas-discharge electron beam gun with a cold annular cathode located between two annular anode electrodes coaxially placed relative to the cathode, and a feedstock supply guide to an area of formation of the melting pool, which is placed along an axis of the said electron beam gun,
   a power supply of the gas-discharge electron beam gun,
   a system of precise positioning of the supporting plate with the base substrate for the formation of three-dimensional objects,
   a vacuum tight operating chamber for enclosing of said base substrate on the supporting plate, said system of precise positioning and optionally enclosing of said electron beam gun, said feedstock and feed means for feeding of feedstock material,
   a vacuum subsystem for creation of a vacuum inside the operating chamber,
   a control system for controlling said gas-discharge electron beam gun, said power supply, said vacuum subsystem of said manufacturing system, and for monitoring of operating conditions,
   wherein an additional magnetic lens is placed on an underside of the electron beam gun coaxially with it and with the feedstock guide, the additional magnetic lens transforming a primary hollow electron beam, directly generated by the electron beam gun, to the shape of a hollow inverted cone after its leaving a discharge chamber of the electron gun, and allowing adjustment of an angle of inclination of a generating surface of this hollow cone by changing the current in the magnetic lens; and wherein an emission surface of the cold annular cathode is flat in a plane perpendicular to the axis of the electron beam gun and provides direct generation of the electron beam in the form of a hollow cylinder coaxial with the electron gun.

2. The system according to claim 1, wherein the body of the gas-discharge electron beam gun is made in the form of a cylinder with a bottom with a hole in the center for placement of the feedstock guide along the axis and for the formation of an annular gap between the bottom of the cylinder and an inner annular anode electrode attached to the feedstock guide, and an inner diameter of this gap is larger than an inner diameter of the annular cathode.

3. The system according to claim 1, wherein the position of the magnetic lens along the axis of the gun is fixed or variable.

4. The system according to claim 1, wherein the feedstock guide in the functional assembly is movable and adjustable in distance, such that it protrudes beyond the body of the electron gun.

\* \* \* \* \*